United States Patent
Kelley et al.

(10) Patent No.: US 6,222,764 B1
(45) Date of Patent: Apr. 24, 2001

(54) ERASABLE MEMORY DEVICE AND AN ASSOCIATED METHOD FOR ERASING A MEMORY CELL THEREIN

(75) Inventors: Patrick J. Kelley; Chung Wai Leung; Ranbir Singh, all of Orlando, FL (US)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/460,160

(22) Filed: Dec. 13, 1999

(51) Int. Cl.[7] .................................................. G11C 16/04
(52) U.S. Cl. .............................. 365/185.07; 365/185.2; 365/185.29
(58) Field of Search .................... 365/185.07, 185.26, 365/185.29, 185.24, 185.2

(56) References Cited

U.S. PATENT DOCUMENTS

| | | | |
|---|---|---|---|
| 5,465,231 | * 11/1995 | Ohsaki | 365/185.33 |
| 5,604,700 | * 2/1997 | Parris et al. | 365/185.1 |
| 5,942,936 | * 8/1999 | Ricco et al. | 327/563 |
| 6,064,595 | * 5/2000 | Logie et al. | 365/185.18 |

OTHER PUBLICATIONS

"A Single Poly EEPROM Cell Structure for Use in Standard CMOS Process", Ohsaki et al., IEEE Journal of Solid State Circuits, vol. 29, No. 3 Mar. 1994.

* cited by examiner

Primary Examiner—David Nelms
Assistant Examiner—Thong Le
(74) Attorney, Agent, or Firm—Allen, Dyer, Doppelt, Milbrath & Gilchrist, P.A.

(57) ABSTRACT

An electrically erasable memory device includes a substrate and a plurality of single poly layer memory cells in the substrate. Each single poly layer memory cell includes a first MOS transistor in a first region in the substrate and spaced apart source and drain regions. Each single poly layer memory cell further includes a capacitor having a first electrode overlying a second region in the substrate and an insulating layer therebetween, and a third region in the second region defining a second electrode. An erasing circuit selectively erases the single poly layer memory cell by supplying a first voltage reference of a first polarity to the spaced apart source and drain regions, a second voltage reference of a second polarity to the first region, and a third voltage reference of the second polarity to the second electrode of the capacitor. The first and second voltage references bias the first MOS transistor so that the third voltage reference for erasing the single poly layer memory cell does not cause a junction breakdown of the first MOS transistor.

29 Claims, 2 Drawing Sheets

ERASABLE MEMORY DEVICE AND AN ASSOCIATED METHOD FOR ERASING A MEMORY CELL THEREIN

FIELD OF THE INVENTION

The present invention relates to the field of semiconductor memories, and, more particularly, to an electrically erasable programmable read only memory (EEPROM).

BACKGROUND OF THE INVENTION

Non-volatile memories are used in a variety of products because they retain their contents even when power is no longer supplied. An electrically erasable programmable read only memory (EEPROM) is a type of non-volatile memory that permits the contents to be erased and different data to be stored therein.

A typical EEPROM device includes an array of memory cells, and, each memory cell includes a floating gate and a control gate over the floating gate. The floating gate is positioned over a channel of the transistor that is defined between spaced apart source and drain regions formed in a semiconductor substrate. Intervening insulating layers are between the channel and floating gate, and between the floating gate and control gate. One type of memory cell configuration is a stacked gate arrangement wherein the control gate is directly over the floating gate. Another type of memory cell configuration is the split gate arrangement wherein the control gate extends over the floating gate, but also extends laterally adjacent the floating gate over a portion of the channel of the transistor.

A disadvantage of the stacked and split gate arrangements is that they can not be manufactured through the standard complementary metal oxide semiconductor (CMOS) process. This is due to the standard CMOS process using a single layer polysilicon deposition step whereas the stacked and split gate arrangements require two polysilicon deposition steps for the floating gate and the control gate.

A CMOS EEPROM with the control gate and the floating gate formed with a single poly layer is disclosed in U.S. Pat. No. 5,886,376 to Ohsaki and in an article titled "A Single Poly EEPROM Cell Structure For Use In Standard CMOS Process", by Ohsaki et al., IEEE Journal of Solid-State Circuits, Vol. 29, No. 3, March 1994. The disclosed single poly layer memory cell includes adjacently placed NMOS and PMOS transistors. A common polysilicon gate with respect to the NMOS and PMOS transistors serves as the floating gate, and the well region of the PMOS transistor serves as the control gate for the memory cell.

However, there are two problems with erasing a single poly layer memory cell as disclosed in the Ohsaki patent and in the Ohsaki et al. article. One approach to erasing a charge of the floating gate requires a high erase voltage applied to the spaced apart source and drain regions and to the n-well of the PMOS transistor while the NMOS transistor is grounded. When the gate capacitance ratio, i.e., a ratio of the capacitance of the gate of the PMOS transistor to the capacitance of the gate of the NMOS transistor, is much greater than 1, the high erase voltage approaches the junction breakdown voltage of the n-well to the p-well which is about 13 to 15 volts for 0.25 micron technology. A well or tub breakdown reduces device reliability and data retention.

Another approach to erasing a charge of the floating gate requires a high erase voltage applied to the spaced apart source and drain regions of the NMOS transistor while the PMOS transistor is grounded. Depending on the gate capacitance ratio, this high erase voltage approaches the junction breakdown of the PMOS transistor, which is about 7 to 9 volts for 0.25 micron technology. A drain voltage close to the junction breakdown voltage during erase can lead to hole injection into the floating gate, and can thus reduce device reliability and data retention.

SUMMARY OF THE INVENTION

An object of the present invention is to provide an erasable memory device and an associated method for erasing a memory cell therein without reducing device reliability and data retention of the erased memory cell.

This and other objects, advantages and features in accordance with the present invention are provided by an electrically erasable memory device comprising a substrate and a plurality of memory cells in the substrate. Each memory cell preferably comprises a first region having a first conductivity type in the substrate, and a first MOS transistor in the first region and comprising spaced apart source and drain regions defining a channel therebetween and a gate overlying the channel. A second region having a second conductivity type in the substrate is preferably laterally adjacent to the first region wherein a capacitor comprising a first electrode preferably overlies the second region and an insulating layer is therebetween, and a third region having the first conductivity type is preferably in the second region defining a second electrode. The gate of the first MOS transistor and the first electrode of the capacitor are preferably connected together to define a floating gate, and the second region of the capacitor preferably serves as a control gate. In other words, the floating gate and the control gate of the memory cell are formed as a result of a single poly layer deposition step during the CMOS process.

The electrically erasable memory device preferably further comprises an erasing circuit for selectively erasing at least one of the memory cells by supplying a first voltage reference of a first polarity to the spaced apart source and drain regions of the first MOS transistor, a second voltage reference of a second polarity to the first region, and a third voltage reference of the second polarity to the second electrode in the third region.

The first and second voltage references advantageously bias the first MOS transistor so that the third voltage reference for erasing the selected memory cell does not cause a junction breakdown of the first MOS transistor. In other words, the bias voltage applied to the first MOS transistor allows a lower erase voltage to be applied to the memory cell for removing a charge of the floating gate. In addition, when the bias voltage is applied to the first MOS transistor, the time required for erasing the data is significantly reduced. This aspect of the invention is particularly advantageous when the gate capacitance ratio, i.e., a ratio of the capacitance of the capacitor to the capacitance of the gate of the first MOS transistor, is greater than 1.

The first voltage reference preferably has an absolute value less than about 7 volts, the second voltage reference preferably has an absolute value in a range of about 0 to 2 volts, and the third voltage reference has an absolute value in a range of about 3 o 7 volts. Depending on the technology size of the electrically erasable memory device, the third voltage reference is such that it does not cause a junction breakdown of the first MOS transistor as a result of the first and second voltage references. The first conductivity type is preferably P conductivity type, and the second conductivity type is preferably N conductivity type.

Another aspect of the present invention relates to a method for erasing a single poly layer memory cell in an electrically erasable memory device. The method preferably comprises the steps of supplying a first voltage reference of a first polarity to spaced apart source and drain regions of a first MOS transistor in a first region of a first conductivity type of the single poly layer memory cell; supplying a second voltage reference of a second polarity to the first region; and supplying a third voltage reference of the second polarity to an electrode of a capacitor in a second region laterally adjacent the first region.

The first and second voltage references preferably bias the first MOS transistor so that the third voltage reference for erasing the single poly memory cell does not cause a junction breakdown of the first MOS transistor.

DETAILED DESCRIPTION OF THE DRAWINGS

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
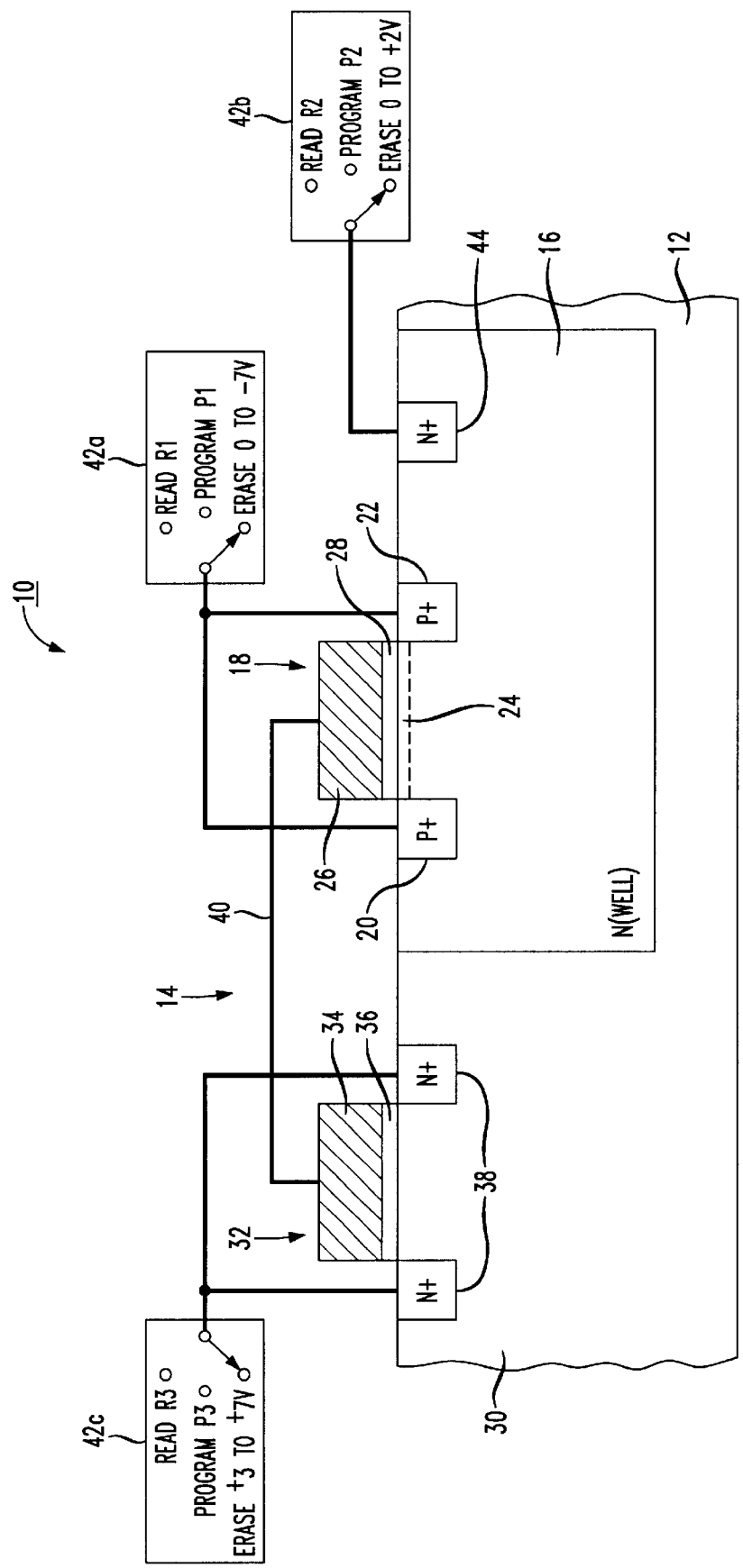
FIG. 1 is a schematic cross-sectional view of a single poly memory cell and an associated erase circuit of an EEPROM in accordance with the present invention.

Referring to FIG. 1, an electrically erasable memory device, generally indicated at 10, is described in accordance with the present invention. The memory device 10 includes a substrate 12 and a plurality of memory cells formed in the substrate, with only one memory cell 14 being illustrated for clarity. The memory cell 14 includes a first region 16 having a first conductivity type in the substrate 12. In the illustrated embodiment, the first region 16 is of N conductivity type. A first MOS transistor 18 is formed in the first region 16 and comprises spaced apart source and drain regions 20, 22 defining a channel 24 therebetween and a gate 26 overlying the channel. An insulating or gate oxide layer 28 separates the gate 26 and the channel 24. The insulating layer 28 may have a thickness in a range of about 5 to 12 nm.

The memory cell 10 further comprises a second region 30 having a second conductivity type in the substrate 12 laterally adjacent to the first region 16. In the illustrated embodiment, the second region 30 is of P conductivity type. A capacitor 32 comprising a first electrode 34 is formed overlying the second region 30 and an insulating or oxide layer 36 is also provided therebetween. A second electrode of the capacitor 32 is formed in the second region 30 by at least one third region 38 having a first conductivity type. The gate 26 of the first MOS transistor 18 and the first electrode 34 of the capacitor 32 are connected together to define a floating gate, indicated generally at 40, and the second region 30 serves as a control gate.

The memory device further includes an erasing circuit for selectively erasing at least one of the memory cells by supplying specific voltages as will now be described. The erasing circuit is provided by the schematically illustrated three voltage sources and associated switches 42a–42c. These voltage sources can be provided by on-chip or external circuitry, or a combination thereof, as will be appreciated by one skilled in the art. One or more external input pins may be provided within an overall integrated circuit package and connected to respective pads of the integrated circuit to receive external voltage(s).

In the illustrated embodiment, the switches 42a–42c are shown in the erase positions. Accordingly, a first voltage reference of a negative polarity is supplied to the spaced apart source and drain regions 20, 22 of the first MOS transistor 18 by the first voltage source and associated switch 42a. This first voltage reference has an absolute value less than about 7 volts.

A second voltage reference is applied to the first region 16 by the second voltage source and associated switch 42b. This second voltage reference has an absolute value in a range of about 0 to 2 volts. An N+ region 44 is provided in the first region 16 for coupling the second voltage reference to the first region. In addition, a third voltage reference of a positive polarity is applied to the second electrode 38 in the second region 30 by the third voltage source and associated switch 42c. This third voltage reference has an absolute value in a range of about 3 to 7 volts. Those of skill in the art will appreciate that the various semiconductor regions can be reversed, which will also entail a reversal of the polarities of the various voltage sources.

Those of skill in the art will also readily appreciate that the memory device 10 can supply programming voltages P1–P3, and reading voltages R1–R3 from the respective voltage sources and switch circuits 42a–42c. Accordingly, these voltages and associated circuit portions need no further discussion herein.

Figure 2:
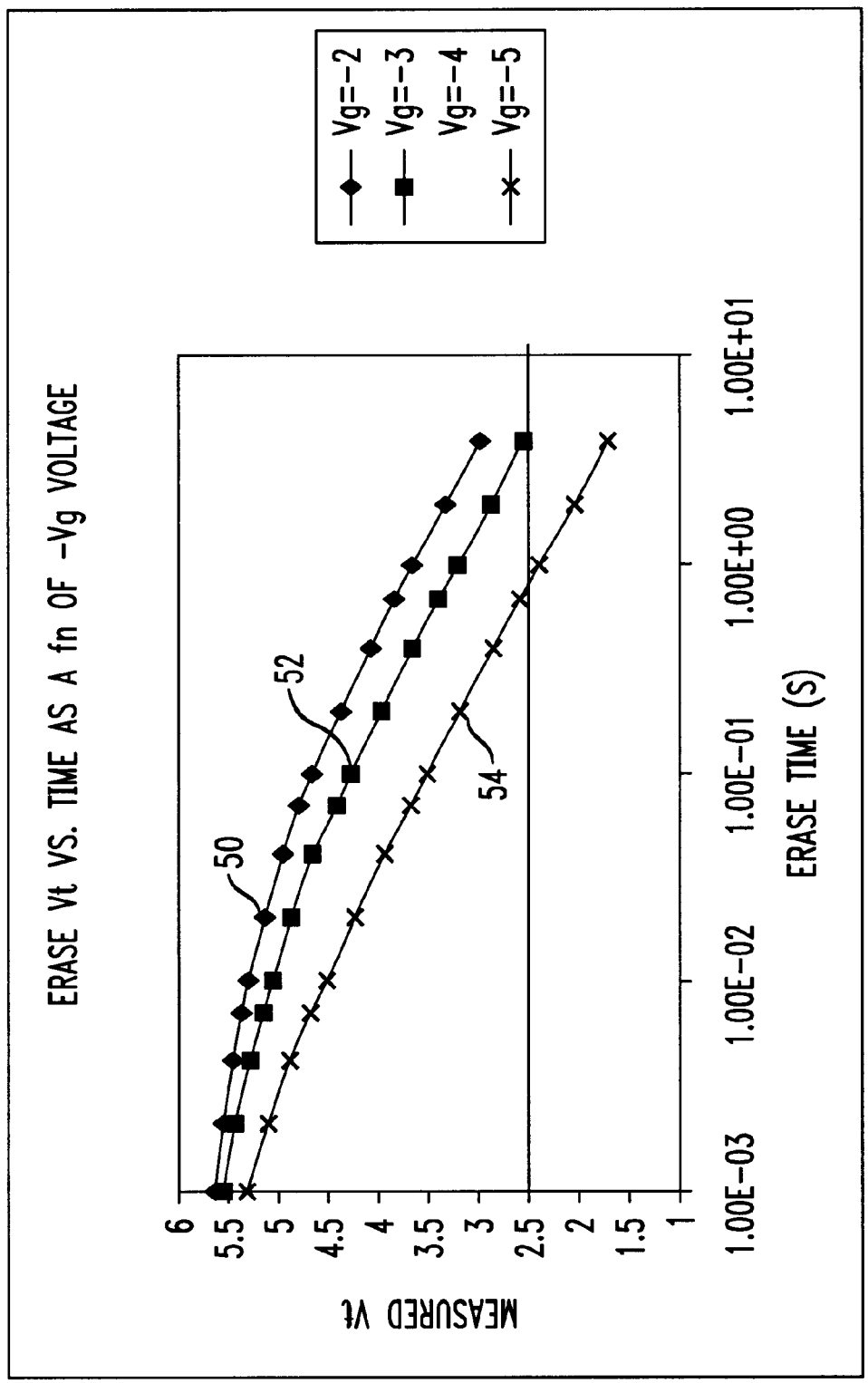
FIG. 2 is a graph of the erase voltage versus time of the single poly memory cell illustrated in FIG. 1 for various bias voltage levels.

In accordance with a significant feature of the present invention, the first and second voltage references advantageously bias the first MOS transistor 18 so that the third voltage reference for erasing the selected memory cell 14 does not cause a junction breakdown of the first MOS transistor. In other words, the bias voltages applied to the first MOS transistor 18 allows a lower erase voltage to be applied to the memory cell 14 for removing a charge of the floating gate 40. In addition, when the bias voltage is applied to the first MOS transistor 18, the time required for erasing the data is significantly reduced as best shown in FIG. 2.

Referring now to the graph illustrated in FIG. 2, the necessary erase voltage versus time for a selected memory cell 14 will be discussed for various bias voltage levels applied to the spaced apart source and drain regions 20, 22 of the first MOS transistor 18. For example, when −2 volts is applied to the source and drain regions 20, 22 as indicated by reference 50 in FIG. 2, an erase voltage of 5.6 volts is required with a corresponding erase time of about 10 seconds. When −3 volts is applied to the source and drain regions 20, 22 as indicated by reference 52, an erase voltage of 5.5 volts is required with a corresponding erase time of about 7 seconds. Similarly, when −5 volts is applied to the source and drain regions 20, 22 as indicated by reference 54, an erase voltage of 5.3 volts is required with a corresponding erase time of about 1 second.

As the negative bias voltage applied to the source and drain regions 20, 22 of the first MOS transistor 18 becomes more negative, the required voltage for causing the first MOS transistor to conduct, and therefore erase the charge stored of the floating gate 40, is lowered. The memory cell 14 can thus be erased without causing a junction breakdown of the first MOS transistor 18 since the required voltage is lower as a result of biasing the first MOS transistor. This aspect of the present invention is particularly important when the capacitance ratio, i.e., a ratio of the capacitance of the capacitor 32 to the capacitance of the gate 26 of the first MOS transistor 18, is greater than 1. The high erase voltage necessary for erasing the memory cell 14 without biasing the first MOS transistor 18 approaches the junction breakdown voltage of the first MOS transistor 18, which is about 7 to 9 volts for 0.25 micron technology. A drain voltage close to the junction breakdown voltage during erase can lead to hole injection into the floating gate, and can thus reduce device reliability and data retention.

Another aspect of the present invention relates to a method for erasing a single poly layer memory cell 14 in an electrically erasable memory device 10. The method comprises the steps of supplying a first voltage reference of a first polarity to spaced apart source and drain regions 20, 22 of a first MOS transistor 18 in a first region 16 of a first conductivity type of the single poly layer memory cell 14; supplying a second voltage reference of a second polarity to the first region; and supplying a third voltage reference of the second polarity to an electrode 38 of a capacitor 32 in a second region 30 laterally adjacent the first region.

The first and second voltage references preferably bias the first MOS transistor 18 so that the third voltage reference for erasing the single poly memory cell 14 does not cause a junction breakdown of the first MOS transistor.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An electrically erasable memory device comprising:
   a substrate and a plurality of memory cells in said substrate, each memory cell comprising
      a first region having a first conductivity type in said substrate,
      a first MOS transistor in said first region and comprising spaced apart source and drain regions defining a channel therebetween and a gate overlying said channel,
      a second region having a second conductivity type in said substrate laterally adjacent said first region,
      a capacitor comprising a first electrode overlying said second region and an insulating layer therebetween, and a third region having the first conductivity type in said second region defining a second electrode, and
      said gate of said first MOS transistor and said first electrode of said capacitor being connected together to define a floating gate, and said second region serving as a control gate; and
   an erasing circuit for selectively erasing at least one of said memory cells by supplying a first voltage reference of a first polarity to said spaced apart source and drain regions of said first MOS transistor, a second voltage reference of a second polarity to said first region, and a third voltage reference of the second polarity to said third region, so that a junction breakdown voltage of said first MOS transistor is not exceeded.

2. The electrically erasable memory device according to claim 1, wherein the first voltage reference has an absolute value less than about 7 volts.

3. The electrically erasable memory device according to claim 1, wherein the second voltage reference has an absolute value in a range of about 0 to 2 volts.

4. The electrically erasable memory device according to claim 1, wherein the third voltage reference has an absolute value in a range of about 3 to 7 volts.

5. The electrically erasable memory device according to claim 1, wherein the memory device is an electrically erasable and programmable read only memory (EEPROM) device.

6. The electrically erasable memory device according to claim 1, wherein a ratio of a capacitance of the gate of the first MOS transistor to a capacitance of the capacitor is greater than 1.

7. The electrically erasable memory device according to claim 1, wherein said erase circuit is operatively connected to a group of memory cells to erase the group at one time.

8. The electrically erasable memory device according to claim 1, wherein the first conductivity type is P conductivity type, and the second conductivity type is N conductivity type.

9. The electrically erasable memory device according to claim 1, wherein said erase circuit comprises at least one input for receiving a respective voltage from an external source.

10. An electrically erasable memory device comprising:
    a substrate and a plurality of single poly layer memory cells in said substrate, each single poly layer memory cell comprising
       a first MOS transistor in a first region in said substrate and comprising spaced apart source and drain regions,
       a capacitor comprising a first electrode overlying a second region in said substrate and an insulating layer therebetween, and a third region in said second region defining a second electrode; and
    an erasing circuit for selectively erasing at least one of said single poly layer memory cells by supplying a first voltage reference of a first polarity to said spaced apart source and drain regions of said first MOS transistor, a second voltage reference of a second polarity to said first region, and a third voltage reference of the second polarity to said third region.

11. The electrically erasable memory device according to claim 10, wherein said spaced apart source and drain regions of said first MOS transistor define a channel therebetween and said first MOS transistor comprises a gate overlying said channel;
    said gate of said first MOS transistor and said first electrode of said capacitor being connected together to define a floating gate; and
    said second region serving as a control gate.

12. The electrically erasable memory device according to claim 10, wherein the first and second voltage references bias the first MOS transistor so that the third voltage reference for erasing the single poly layer memory cell does not cause a junction breakdown of the first MOS transistor.

13. The electrically erasable memory device according to claim 10, wherein said second region is laterally adjacent to said first region.

14. The electrically erasable memory device according to claim 10, wherein said first region has a first conductivity type; said second region has a second conductivity type; and said third region has the first conductivity type.

15. The electrically erasable memory device according to claim 10, wherein the first voltage reference has an absolute value less than about 7 volts.

16. The electrically erasable memory device according to claim 10, wherein the second voltage reference has an absolute value in a range of about 0 to 2 volts.

17. The electrically erasable memory device according to claim 10, wherein the third voltage reference has an absolute value in a range of about 3 to 7 volts.

18. The electrically erasable memory device according to claim 10, wherein the memory device is an electrically erasable and programmable read only memory (EEPROM) device.

19. The electrically erasable memory device according to claim 10, wherein said erase circuit is operatively connected to a group of memory cells to erase the group at one time.

20. The electrically erasable memory device according to claim 10, wherein the first conductivity type is P conductivity type, and the second conductivity type is N conductivity type.

21. The electrically erasable memory device according to claim 10, wherein said erase circuit comprises at least one input for receiving a respective voltage from an external source.

22. A method for erasing a single poly layer memory cell in an electrically erasable memory device, the method comprising the steps of:

supplying a first voltage reference of a first polarity to spaced apart source and drain regions of a first MOS transistor in a first region of a first conductivity type of the single poly layer memory cell;

supplying a second voltage reference of a second polarity to the first region; and supplying a third voltage reference of the second polarity to an electrode of a capacitor in a second region laterally adjacent the first region.

23. The method according to claim 21, wherein the first and second voltage references bias the first MOS transistor so that the third voltage reference for erasing the single poly layer memory cell does not cause a junction breakdown of the first MOS transistor.

24. The method according to claim 21, wherein the first voltage reference has an absolute value less than about 7 volts.

25. The method according to claim 21, wherein the second voltage reference has an absolute value in a range of about 0 to 2 volts.

26. The method according to claim 21, wherein the third voltage reference has an absolute value in a range of about 3 to 7 volts.

27. The method according to claim 21, wherein the memory device is an electrically erasable and programmable read only memory (EEPROM) device.

28. The method according to claim 21, wherein a group of single poly layer memory cells are erased at one time.

29. The method according to claim 21, wherein the first conductivity type is P conductivity type, and the second conductivity type is N conductivity type.

* * * * *